(12) United States Patent
Jiang et al.

(10) Patent No.: US 11,452,948 B2
(45) Date of Patent: Sep. 27, 2022

(54) EXPERIMENT SYSTEM AND METHOD FOR ACCURATE CONTROLLING OF MACROMOLECULAR CRYSTALLIZATION PROCESS

(71) Applicant: Dalian University of Technology, Dalian (CN)

(72) Inventors: Xiaobin Jiang, Dalian (CN); Mingguang Han, Dalian (CN); Gaohong He, Dalian (CN); Jin Li, Dalian (CN); Xiangcun Li, Dalian (CN); Wu Xiao, Dalian (CN); Xuemei Wu, Dalian (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 807 days.

(21) Appl. No.: 16/349,572
(22) PCT Filed: Dec. 18, 2018
(86) PCT No.: PCT/CN2018/121637
§ 371 (c)(1),
(2) Date: May 13, 2019
(87) PCT Pub. No.: WO2019/128766
PCT Pub. Date: Jul. 4, 2019

(65) Prior Publication Data
US 2020/0108330 A1    Apr. 9, 2020

(30) Foreign Application Priority Data

Dec. 27, 2017 (CN) ......................... 201711443611.3
Dec. 27, 2017 (CN) ......................... 201711443978.5

(51) Int. Cl.
*B01D 9/00* (2006.01)
*G01N 21/84* (2006.01)
(52) U.S. Cl.
CPC ......... *B01D 9/0063* (2013.01); *B01D 9/0045* (2013.01); *B01D 9/0054* (2013.01);
(Continued)

(58) Field of Classification Search
CPC .. B01D 9/0063; B01D 9/0045; B01D 9/0054; B01D 9/0077; B01D 2009/0086;
(Continued)

(56) References Cited

U.S. PATENT DOCUMENTS 2,846,292 A * 8/1958 Harper ...................... C07C 7/14
62/542
5,221,410 A * 6/1993 Kushner ............... B01L 3/5085
117/70
(Continued)

FOREIGN PATENT DOCUMENTS

CA        2560352 A1     3/2008
CN       101440513 A     5/2009
(Continued)

*Primary Examiner* — Joseph W Drodge
(74) *Attorney, Agent, or Firm* — Muncy, Geissler, Olds & Lowe, P.C.

(57) ABSTRACT

An experiment system and method for accurate controlling of macromolecular crystallization process. The system has a platform-equipped horizontal moving slot and channel dedicated backwash module, a droplet adding control module, an observing module, a user observation computer system, and an experimental condition control module. A high-precision movement knob of the x-axis platform and the y-axis platform of the system and the accurate position control of a syringe needle are used to ensure that the macromolecular solution can be added into the correct positions of convex or concave. The crystallization induction period of the target crystal form is determined by the real-time data of the high-speed microcamera, and the crystal cultivation environment is adjusted in real time. This is simple and easy to operate, high in productivity, can be applied to the conventional experimental replication.

4 Claims, 2 Drawing Sheets

(52) U.S. Cl.
CPC .... *B01D 9/0077* (2013.01); *B01D 2009/0086* (2013.01); *G01N 2021/8477* (2013.01)

(58) Field of Classification Search
CPC ........... C30B 7/00; C30B 35/00; C30B 29/58; C30B 29/54; C30B 35/005; C12N 9/00; C12N 9/14; C12N 9/88; G01N 21/01; G01N 21/0332; G01N 2021/0106; G01N 2021/0187; G01N 2021/8477; G01N 33/48; G01N 33/573; G01N 2035/00346; G01N 2035/00425; G01N 2035/00584; G01N 2035/0099; G01N 2333/90; G01N 2333/914; G01N 2333/924; G01N 21/032; C12Q 1/00; C12Q 1/34; C12Q 1/527; C12Q 3/00
See application file for complete search history.

(56) References Cited

U.S. PATENT DOCUMENTS

| | | | |
|---|---|---|---|
| 6,596,081 B1 * | 7/2003 | Arnowitz | C30B 23/00 117/69 |
| 7,438,472 B1 * | 10/2008 | Lazarski | C30B 29/58 378/205 |
| 8,990,023 B2 * | 3/2015 | Sun | C12M 35/00 435/6.1 |
| 2004/0033166 A1 * | 2/2004 | Arnowitz | G01N 21/51 422/82.05 |
| 2008/0077329 A1 * | 3/2008 | Sun | C12M 23/50 702/19 |
| 2009/0147918 A1 * | 6/2009 | Fowler | G01N 23/20025 378/73 |
| 2010/0313995 A1 * | 12/2010 | Gerdts | G01N 35/0099 141/284 |
| 2016/0215411 A1 * | 7/2016 | Ismagilov | C30B 7/14 |

FOREIGN PATENT DOCUMENTS

| | | |
|---|---|---|
| CN | 201780273 U | 3/2011 |
| CN | 103254274 A | 8/2013 |
| CN | 205719867 U | 11/2016 |
| CN | 106568982 A | 4/2017 |
| CN | 108159730 A | 6/2018 |
| CN | 108165486 A | 6/2018 |

* cited by examiner

EXPERIMENT SYSTEM AND METHOD FOR ACCURATE CONTROLLING OF MACROMOLECULAR CRYSTALLIZATION PROCESS

TECHNICAL FIELD

The present invention belongs to the technical field of crystallization, and relates to an experiment system and method for accurate controlling of macromolecular crystallization process.

BACKGROUND

There is an increasing demand for macromolecular drugs which promotes the development of relevant macromolecular pharmaceutical crystallization. From the discovery of the pharmaceutical effects of the macromolecular drugs to the design of pharmaceutical structures, stable production process design and preparation process development have become an important research direction for the commercialization of new drugs. Crystallization process of macromolecular pharmaceutical is the focus of the production process design. Cost and production feasibility in pharmaceutical preparation process are greatly influenced by relevant research on controlling of target pharmaceutical crystal form, shortening of crystal induction period and large-batch preparation of crystals. Due to rapid mutation of pathogens, their ability to adapt to drugs is enhanced, frequent updates of the drugs are needed to deal with the mutated pathogens. Therefore, a large number of target crystals shall be prepared, and the properties of crystal form, particle size, morphology and purity of the crystal system should be guaranteed by the accurate control of the preparation process. It is particularly important to develop an experiment system and method for accurate controlling of macromolecular crystallization process with this goal. CN 103254274A discloses a controlling and optimization device for protein crystals, which is used for determining whether a substance is a target protein under crystal state. However, since the method is merely limited to the biomacromolecules capable of analyzing the structures thereof using X single crystal diffraction technology, it is not universal and is not significant for industrial production and control. At present, there have been no reports on accurate controlling of macromolecular crystals with universality and related devices for crystal observation.

The research has shown that the controlling of the crystal form of macromolecular crystals in a confined space can be accurately enhanced due to the limitation of the surrounding environment, thereby obtaining target crystals, and the shape of the confined space has a positive role for controlling of crystal growth planes. This conclusion not only can be extended to biomacromolecules, but also can solve the problem in macromolecular pharmaceutical crystallization. However, the confined space is not conducive to the observation of the crystal form, the determination of the crystal induction period and the extraction of the crystal, which are related to the crystal system. Therefore, the existing traditional experiment system and monitoring method need to be improved, and a crystal experiment system that integrates observation, environment control and accurate sample injection is needed. Such experiment system needs to satisfy the condition of accurately dripping target system droplets. Meanwhile, the confined structure of a high-precision, micron-scale crystal platform can be any regular patterns. Utilizing the system's high-precision moving mechanisms of x-, y-axis platforms and the accurate position control of a syringe needle, the macromolecular solution can be added into the correct positions of convex or concaves, and crystallization microenvironment of the crystal and accurate operation of later crystal backwash can be guaranteed. Furthermore, the experiment system also needs to facilitate timely screening and controlling of the target crystal form during the experiment and the observation of the crystal. The crystallization induction period of the target crystal form is determined by the real-time data of the high-power camera, and the crystal cultivation environment is adjusted in real time according to the experimental conditions, so as to increase the crystallization efficiency and the success rate.

SUMMARY

The present invention mainly designs an experiment system which provides crystal cultivation environment, position control for droplet addition, observation of crystal growth process and crystal screening, for high-precision macromolecular crystal. The system can be used to quantitatively add target macromolecular solution and observe actual growth of the crystal in real time. A microelement for a macromolecular crystal cultivation platform has convex structures with specific micron-scale surface shapes (including lattice structures or convex structures of grooves) or a microlelement for the macromolecular crystal cultivation platform having groove structures with specific dimensions are processed. Droplets are dripped on the microelement in batch through a matrix type adding apparatus. The output of a target crystal form of a target system is ensured by controlling temperature and humidity conditions around the microlelement platform and by controlling droplet morphology and evaporation rate. The method can provide a crystallization place for all crystalizable systems, especially a small quantity of extracted rare drugs. The method is simple in operation, low in requirements for surrounding environments and fewer in drug loss, and is a simple and environmentally-friendly crystallization technology that can be repeated on a large scale.

The technical solution of the present invention is:

An experiment system for accurate controlling of macromolecular crystallization process is provided, wherein the experiment system is a closed space encircled by a shell 1 at ordinary pressure and is mainly composed of a platform-equipped horizontal moving slot and channel dedicated backwash module I, a droplet adding control module II, an observing module III, a user observation computer system IV, and an experiment condition control module V; the platform-equipped horizontal moving slot and channel dedicated backwash module I, the droplet adding control module II, the observing module III and the experiment condition control module V are positioned inside the closed space, and the user observation computer system IV is positioned outside the closed space.

The platform-equipped horizontal moving slot and channel dedicated backwash module I comprises a platform horizontal moving slot 2, an x-axis horizontal adjusting mechanism 3, a y-axis horizontal adjusting mechanism 4 and a high-throughput macromolecular crystal cultivation platform 5; the high-throughput macromolecular crystal cultivation platform 5 is placed on the platform horizontal moving slot 2; the horizontal position of the platform horizontal moving slot 2 is adjusted through the x-axis horizontal adjusting mechanism 3 and the vertical height of the same is adjusted through the y-axis horizontal adjusting mechanism 4, so as to ensure accurate movement of the high-throughput macromolecular crystal cultivation platform 5.

The droplet adding control module II comprises a sample injector 6, a piston propulsion adjusting mechanism 7 and a sample injector height adjusting mechanism 8, the piston propulsion adjusting mechanism 7 is used for accurately controlling the volume of a droplet added by the sample injector 6, the sample injector height adjusting mechanism 8 is used for controlling the position of the sample injector 6.

The observing module III comprises a high-speed microcamera 9 and a camera adjusting unit 11, the high-speed microcamera 9 is fixed to the camera adjusting unit 11, a state of crystal inside the droplet on the high-throughput macromolecular crystal cultivation platform 5 is observed by controlling the angle, brightness and magnification factor of the high-speed microcamera 9.

The experiment condition control module V comprises a temperature and humidity measurement and control apparatus 13 for controlling humidity and temperature required in the closed space.

The user observation computer system IV comprises a data export line 10 and a user observing computer 12, and is used as an external extension of the observing system for facilitating the user to observe crystal growth under a camera lens of the high-speed microcamera 9 using computer software; the user observing computer 12 is connected with the camera adjusting unit 11 through the data export line 10.

The high-throughput macromolecular crystal cultivation platform 5 comprises a backwash liquor inlet 14, a backwash liquor flow channel 15 and a backwash liquor outlet 16, backwash liquor enters from the backwash liquor inlet 14, and after washing the crystal in the backwash liquor flow channel 15, the backwash liquor flows out of the backwash liquor outlet 16.

The backwash liquor flow channel 15 is a convex or concave structure of micron scale structure with regular patterns. A crystal platform formed by convex structures and concave structures with different layout forms is selected according to actual needs, and there are two layout forms.

The first layout form is a lattice layout, with the convex structures on one side of the crystal platform according to the lattice layout, and with the concave structures on the other side of the crystal platform according to the lattice layout.

The second layout form is a tunnel layout, with the convex structures and the concave structures alternately arranged to form a crystal platform with tunnel type.

According to the morphology of a target crystal system, the sizes of the convex structures and the concave structures are determined, and the height of the convex structures or the concave structures is 10 μm to 500 μm.

For the temperature and humidity measurement and control apparatus 13, the control range of humidity is 10% to 100% and the control range of temperature is −50° C. to 200° C.

The errors of the x-axis horizontal adjusting mechanism 3, the y-axis horizontal adjusting mechanism 4 and the sample injector height adjusting mechanism 8 are one thousandth per 25.4 mm.

Regarding the sample injector 6, for preparing and producing high-throughput crystal, the crystal platform is designed as the tunnel form to facilitate the washing of anti-solvent and the centralized collection of products, and the connected accurate sample injector 6 is selected to improve the sample introduction efficiency; for screening crystals, the crystal platform is designed as the lattice form to improve the repeatability of crystal screening; the crystal platform is made of material that does not react with the target crystal system. The connected sample injector 6 improves the sample introduction efficiency through the following operation: adjusting the x-axis horizontal adjusting mechanism 3 and the y-axis horizontal adjusting mechanism 4, aligning a target site for adding a droplet on the platform with the sample injector 6 of a connected structure 18, adjusting the sample injector height adjusting mechanism (8) according to the height of the high-throughput macromolecular crystal cultivation platform 5, when ready, selecting a sample injector control system 17 to extrude the droplet and the volume of which is indicated by the graduations on the sample injector 6 of the connected structure 18, each sample injector being controlled by the sample injector control system 17 to ensure that the amount of the droplets extruded by each sample injector of the sample injectors 6 of the connected structure 18 are identical and processing capacities are consistent. The method uses the connected structure 18 to connect a plurality of sample injectors 6 in series or in parallel to increase output efficiency.

The magnification factor of the high-speed microcamera 9 is 10 to 600 times. An experiment method for accurate controlling of macromolecular crystallization process comprises the following steps:

(1) placing crystal culture solution prepared with target crystal system and solvent at a temperature of 20-30° C. for standby; disinfecting the crystal platform, wherein the solvent is distilled water or anhydrous alcohol; adding the prepared crystal culture solution into the sample injector 6; placing the high-throughput macromolecular crystal cultivation platform 5 on the platform horizontal moving slot 2 to complete preparation before crystal cultivation;

(2) adjusting the temperature and humidity measurement and control apparatus 13 so that temperature and humidity conditions in the closed space reach the values set during crystallization, wherein temperature and humidity throughout the experiment are controlled by the experiment condition control module V;

(3) adjusting the x-axis horizontal adjusting mechanism 3 and the y-axis horizontal adjusting mechanism 4 during the experiment, aligning a target site for adding a droplet on the high-throughput macromolecular crystal cultivation platform 5 with the sample injector 6, adjusting the sample injector height adjusting mechanism 8 according to the height of the high-throughput macromolecular crystal cultivation platform 5, when ready, rotating a piston propulsion mechanism 7 to extrude the droplet, the volume of which is indicated by the graduations on the sample injector 6;

(4) observing the state of the crystal droplet through the high-speed microcamera 9 of the observing module III, converting the observed content into an electrical signal and presenting on the user observing computer 12 through the data export line 10, and collecting and storing crystallization pictures or videos; and (5) taking out the high-throughput macromolecular crystal cultivation platform 5 from the platform horizontal moving slot 2 when crystal cultivation is completed, connecting a pipeline of the anti-solvent to the backwash liquor inlet 14 to start washing, washing liquid passing through the backwash liquor flow channel 15 and being collected at the backwash liquor outlet 16, and backwashing out the crystal to complete the operation of high-throughput crystal cultivation.

The present invention has the following beneficial effects: utilizing the system's high-precision moving mechanisms of the x-, y-axis platforms and the accurate position control of a syringe needle, the macromolecular solution can be added into the correct positions of convex or concave, and crystallization microenvironment of the crystal and accurate operation of later crystal backwash can be guaranteed. The crystallization induction period of the target crystal form is determined by the real-time data of the high-power camera, and the crystal cultivation environment is adjusted in real time according to the experimental conditions, so as to increase the crystallization efficiency and the success rate. For crystal production requirements of high throughput and large output, connected injection can be adopted, so as to ensure the accuracy and to realize high-throughput crystal production.

DESCRIPTION OF DRAWINGS

In FIG. 1: 1 shell; 2 platform horizontal moving slot; 3 x-axis horizontal adjusting mechanism;

4 y-axis horizontal adjusting mechanism; 5 high-throughput macromolecular crystal cultivation platform; 6 sample injector;

7 piston propulsion adjusting mechanism; 8 sample injector height adjusting mechanism; 9 high-power camera;

10 data export line; 11 camera adjusting unit; 12 user observing computer; 13 temperature and humidity measurement and control apparatus; 14 backwash liquor inlet; 15 backwash liquor flow channel;

16 backwash liquor outlet; I platform-equipped horizontal moving slot and channel dedicated backwash module;

II droplet adding control module; III observing module; IV user observation computer system; and V experiment condition control module.

Figure 1:
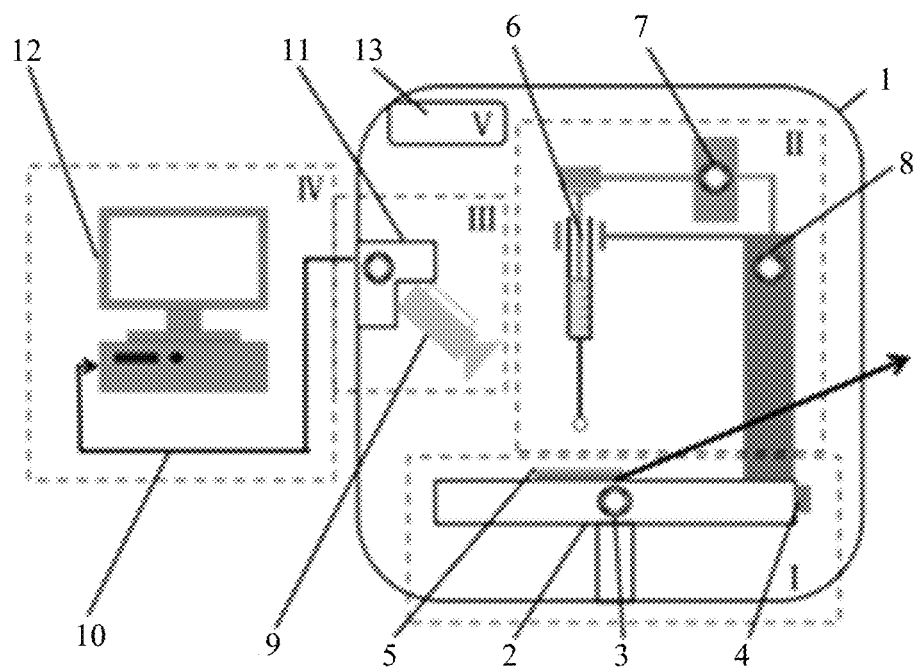
FIG. 1 is a side view of the system.
Figure 2:
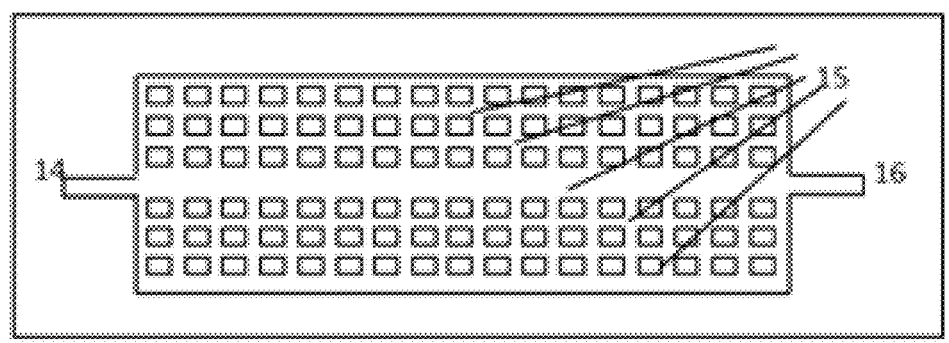
FIG. 2 is a local amplified schematic diagram of a high-throughput macromolecular crystal cultivation platform of the system.
Figure 3:
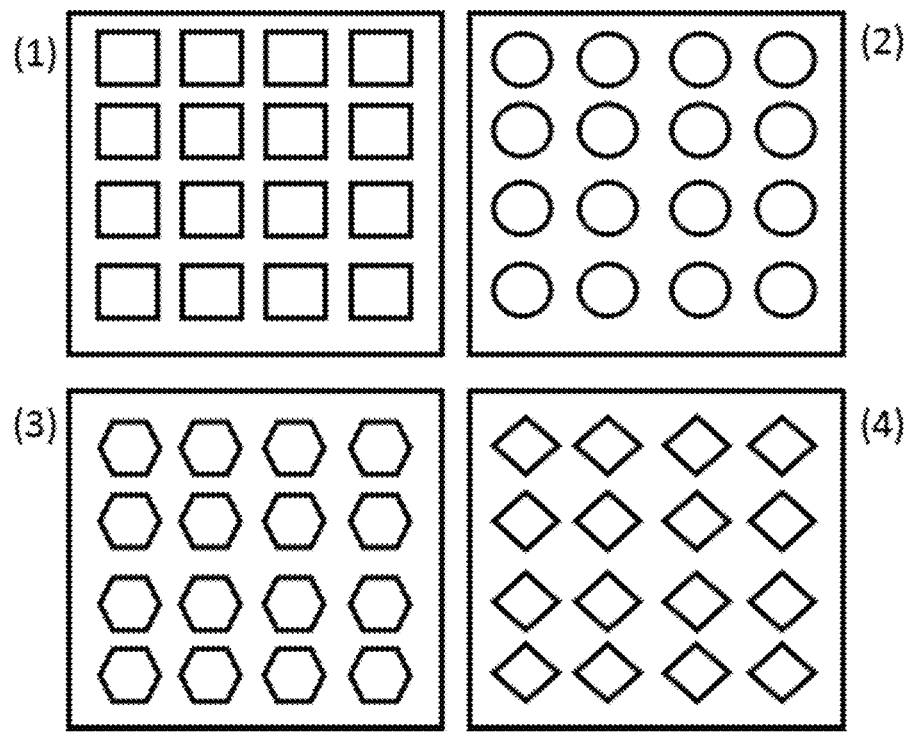
FIG. 3 is a top view of design of four crystal cultivation platforms applicable to the system.

In FIG. 3: each picture is part of a high-precision crystal platform and the feature size of each structure is 0.01 mm to 0.5 mm, wherein (1) square structure; (2) circular structure; (3) hexagonal structure; and (4) diamond structure; each feature structure may be a convex structure or a concave structure as needed.

Figure 4:
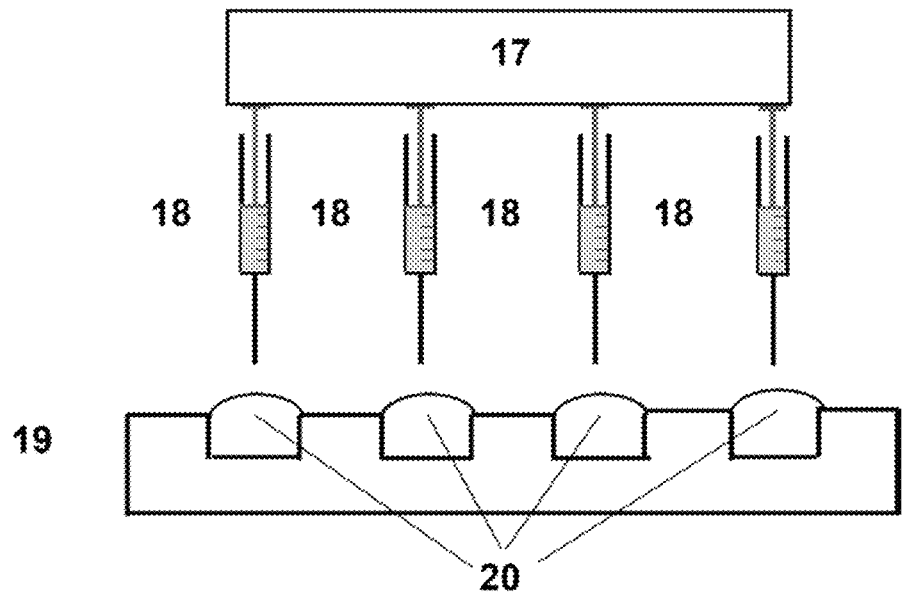
FIG. 4 is an operation schematic diagram of a high-throughput connected sample injector.

In FIG. 4: 17 sample injector control system; 18 connected structure (a plurality of 6 sample injectors are attached); 19 micron-scale crystal platform (10 micron to 500 micron); and 20 droplet adding groove (anti-solvent washing channel).

DETAILED DESCRIPTION

Specific embodiments of the present invention are further described below in combination with the drawings and the technical solution.

The use method of the present invention is elaborated with the examples of lysozyme crystal cultivation.

Example 1 Crystal Screening of Lysozyme Using Sample Injector 6

Lysozyme crystal culture solution was prepared and put into the sample injector 6. The high-throughput macromolecular crystal cultivation platform 5 was placed on the platform horizontal moving slot 2, so that the preparation before crystal cultivation was completed.

The temperature and humidity measurement and control apparatus 13 was adjusted so that the temperature and humidity conditions in the closed space of the shell 1 reached the values set during lysozyme crystallization. Temperature and humidity throughout the experiment were controlled by the experiment condition control module V.

The x-axis horizontal adjusting mechanism 3 and the y-axis horizontal adjusting mechanism 4 were adjusted during the experiment, a target site for adding a droplet on the platform was aligned with the sample injector 6, the sample injector height adjusting mechanism 8 was adjusted according to the height of the high-throughput macromolecular crystal cultivation platform 5, when ready, a piston propulsion mechanism 7 was rotated to extrude the droplet, and the volume of which was indicated by the graduations on the sample injector 6.

The state of the crystal droplet was observed through the high-speed microcamera 9 of the observing module III, the observed content was converted into an electrical signal and presented on the user observing computer 12 through the data export line 10, and crystallization pictures or videos were collected and stored.

The high-throughput macromolecular crystal cultivation platform 5 was taken out from the platform horizontal moving slot 2 when lysozyme crystal cultivation was completed, a pipeline of the anti-solvent was connected to the backwash liquor inlet 14 to start washing, washing liquid passed through the backwash liquor flow channel 15 and was collected at the backwash liquor outlet 16, and the crystal was backwashed out to complete the operation of high-throughput crystal cultivation.

Example 2 High-Throughput Output of Lysozyme Using Sample Injector 6 of Connected Structure 18

Lysozyme crystal culture solution was prepared and put into the sample injector 6 of the connected structure 18 for standby. The high-throughput macromolecular crystal cultivation platform 5 was placed on the platform horizontal moving slot 2, so that the preparation before crystal cultivation was complete.

The method of adjusting the temperature and the humidity was in accordance with that of Example 1. The x-axis horizontal adjusting mechanism 3 and the y-axis horizontal adjusting mechanism 4 were adjusted, a target site for adding a droplet on the platform was aligned with the sample injector 6 of the connected structure 18, the sample injector height adjusting mechanism 8 was adjusted according to the height of the high-throughput macromolecular crystal cultivation platform 5, when ready, a sample injector control system 17 was selected to extrude the droplet and the volume of which was indicated by the graduations on the sample injector 6 of the connected structure 18, each sample injector was controlled by the sample injector control system 17 to ensure that the amount of the droplets extruded by each sample injector of the sample injectors 6 of the connected structure 18 were identical and processing capacities were consistent. As shown in FIG. 4, the same repeatable droplet morphology 20 can be obtained on a micron-scale crystal platform 19.

The means of observing crystal morphology was in accordance with that of Example 1. The high-throughput macromolecular crystal cultivation platform 5 was taken out from the platform horizontal moving slot 2 when lysozyme crystal cultivation was completed, a pipeline of the anti-solvent was connected to the backwash liquor inlet 14 to start washing, washing liquid passed through the backwash liquor flow channel 15 and was collected at the backwash liquor outlet 16; and the crystal was backwashed out to complete the operation of high-throughput crystal cultivation.

The method uses the connected structure (18) to connect a plurality of sample injectors (6) in series or in parallel to improve the output efficiency. The method is simple and easy to operate, high in productivity, can be applied to the conventional experiment replication as well as exploration of limiting crystallization conditions. The above description is only simple embodiments of the present invention and is not limited to the present invention. Equivalent replacement, name amendment, apparatus improvement, etc., which are similar to the present invention shall be included within the protection scope of the present invention.

The invention claimed is:

1. An experiment-controlling system for accurate controlling of a macromolecular crystallization process, wherein the experiment system is a closed space encircled by a shell and is comprised of a platform-equipped horizontal moving slot and channel dedicated backwash module, a droplet adding control module, an observing module, a user observation computer system, and an experiment condition control module, the platform-equipped horizontal moving slot and channel dedicated backwash module, the droplet adding control module, the observing module and the experiment condition control module are positioned inside the closed space, and the user observation computer system is positioned outside the closed space;

wherein the platform-equipped horizontal moving slot and channel dedicated backwash module comprises a platform horizontal moving slot, an x-axis horizontal adjusting mechanism, a y-axis horizontal adjusting mechanism and a high-throughput macromolecular crystal cultivation platform, the high-throughput macromolecular crystal cultivation platform is placed on the platform horizontal moving slot, the horizontal position of the platform horizontal moving slot is adjusted through the x-axis horizontal adjusting mechanism, and the vertical height of the platform horizontal moving slot is adjusted through the y-axis horizontal adjusting mechanism, so as to ensure accurate movement of the high-throughput macromolecular crystal cultivation platform;

wherein the droplet adding control module comprises a sample injector, a piston propulsion adjusting mechanism and a sample injector height adjusting mechanism, the piston propulsion adjusting mechanism is used for accurately controlling a volume of a droplet added by the sample injector, and the sample injector height adjusting mechanism is used for controlling the position of the sample injector;

wherein the observing module comprises a high-speed microcamera and a camera adjusting unit, the high-speed microcamera is fixed to the camera adjusting unit, and a state of crystal inside the droplet on the high-throughput macromolecular crystal cultivation platform is observed by controlling the angle, brightness and magnification factor of the high-speed microcamera;

wherein the experiment condition control module comprises a temperature and humidity measurement and control apparatus for controlling humidity and temperature required in the closed space;

wherein the user observation computer system comprises a data export line and a user observing computer, and is used as an external extension of the observing system for facilitating the user to observe crystal growth under a camera lens of the high-speed microcamera using computer software, and the user observing computer is connected with the camera adjusting unit through the data export line; and wherein the high-throughput macromolecular crystal cultivation platform comprises a backwash liquor inlet, a backwash liquor flow channel and a backwash liquor outlet, backwash liquor enters from the backwash liquor inlet, and after washing the crystal in the backwash liquor flow channel, the backwash liquor flows out of the backwash liquor outlet.

2. The experiment-controlling system for accurate controlling of the macromolecular crystallization process according to claim 1, wherein the backwash liquor flow channel is a convex or concave structure of micron scale structure with regular patterns; the high-throughput macromolecular crystal cultivation platform is formed by convex structures and concave structures with two different layout forms;

a first layout form of a lattice layout, with the convex structures on one side of the high-throughput macromolecular crystal cultivation platform according to the lattice layout, and with the concave structures on the other side of the high-throughput macromolecular crystal cultivation platform according to the lattice layout; and a second layout form of a tunnel layout, with the convex structures and the concave structures alternately arranged to form the high-throughput macromolecular crystal cultivation platform with tunnel type.

3. The experiment-controlling system for accurate controlling of the macromolecular crystallization process according to claim 2, wherein according to a morphology of a macromolecule crystallization solution, sizes of the convex structures and the concave structures are determined, and a height of the convex structures or the concave structures is 10 μm to 500 μm.

4. An experiment-controlling method for accurate controlling of the macromolecular crystallization process by using the experiment system of claim 1, comprising the following steps:

(1) preparing a crystal culture solution with a macromolecule crystallization solution and solvent at a temperature of 20-30° C.; disinfecting the high-throughput macromolecular crystal cultivation platform; adding the crystal culture solution into the sample injector; placing the high-throughput macromolecular crystal cultivation platform on the platform horizontal moving slot to complete preparation before crystal cultivation;

(2) adjusting temperature and humidity measurement and control apparatus so that temperature and humidity conditions in a closed space reach values set during crystallization, wherein temperature and humidity throughout an experiment are controlled by the experiment condition control module;

(3) adjusting the x-axis horizontal adjusting mechanism and the y-axis horizontal adjusting mechanism during the experiment, aligning a target site for adding a droplet on the high-throughput macromolecular crystal cultivation platform with the sample injector, adjusting the sample injector height adjusting mechanism according to a height of the high-throughput macromolecular crystal cultivation platform, and rotating a piston propulsion mechanism to extrude the droplet, the volume of which is indicated by graduations on the sample injector;

(4) observing the state of the crystal droplet through the high-speed microcamera of the observing module, converting an observed content into an electrical signal and presenting on a user observing computer through a data export line, and collecting and storing crystallization pictures or videos; and (5) taking out the high-throughput macromolecular crystal cultivation platform from the platform horizontal moving slot, connecting a pipeline of anti-solvent to the backwash liquor inlet to start washing, washing liquid passing through the backwash liquor flow channel and being collected at the backwash liquor outlet, and backwashing out the crystal to complete operation of high-throughput crystal cultivation.

* * * * *